United States Patent [19]
Hinton et al.

[11] Patent Number: 4,754,132
[45] Date of Patent: Jun. 28, 1988

[54] SYMMETRIC OPTICAL DEVICE WITH QUANTUM WELL ABSORPTION

[75] Inventors: Harvard S. Hinton, Naperville; Anthony L. Lentine, St. Charles, both of Ill.; David A. B. Miller, Fairhaven, N.J.

[73] Assignee: American Telephone and Telegraph Company, AT&T Bell Laboratories, Murray Hill, N.J.

[21] Appl. No.: 42,411

[22] Filed: Apr. 24, 1987

[51] Int. Cl.$^4$ .............................................. H01J 40/14
[52] U.S. Cl. .......................... 250/211 J; 250/213 A; 377/102
[58] Field of Search .............. 250/211 R, 211 J, 578, 250/213 A; 365/109, 110, 112; 377/102; 357/30 R, 24 LR

[56] References Cited

U.S. PATENT DOCUMENTS

| | | | |
|---|---|---|---|
| 3,753,247 | 8/1973 | Rajchman | 365/112 |
| 4,166,224 | 8/1979 | Hutson | 357/30 |
| 4,546,244 | 10/1985 | Miller | 250/211 |
| 4,691,111 | 9/1987 | Bovino | 250/211 J |

OTHER PUBLICATIONS

D. A. B. Miller et al., "The Quantum Well Self-Electrooptic Effect Device: Optoelectronic Bistability and Oscillation, and Self-Linearized Modulation", *IEEE Journal of Quantum Electronics*, vol. QE-21, No. 9, Sep. 1985, pp. 1462–1476.

D. A. B. Miller et al., "Integrated Quantum Well Self-Electro-Optic Effect Device: 2×2 Array of Optically Bistable Switches", *Applied Physics Letters*, vol. 49, No. 13, Sep. 1986, pp. 821–823.

*Primary Examiner*—David C. Nelms
*Attorney, Agent, or Firm*—Richard J. Godlewski

[57] ABSTRACT

An optically bistable device 100 is disclosed having first and second semiconductor multiple quantum well regions 101 and 102 with complementary high and low absorption levels for emitting first and second output light beams 162 and 163 having complementary low and high power levels. The optical device comprises first and second photodetectors 103 and 104 having respective quantum well regions 101 and 102. The photodetectors are responsive to first and second light beams 160 and 161 for electrically controlling the optical absorption of each of the two quantum well regions. The state of the device is determined by the transmission level of light beam 161 passing through multiple quantum well region 102 and being emitted as output light beam 162, whereas the complementary state of the device is determined by the transmission level of complementary output light beam 162. A variable optical attenuator 701 concomitantly and proportionally varies the power level of input light beams 160 and 161 to maintain the state of the device over a wide range of input powers. When operated in the bistable operating region of the device, either one of control light beams 180 and 181 with a low power level changes the device from one state to the other. Two threshold values of the ratio of the power of the light incident on the two photodetectors establishes where the device switches from one state to the other.

22 Claims, 8 Drawing Sheets

| | | | | |
|---|---|---|---|---|
| 810 & 811 | | X=0 | n=10¹⁸ | 1050Å |
| 808 & 809 | | X=0.4 | n=10¹⁸ | 6400Å |
| 101 & 102 | 63 PERIODS | X=0 | | 105Å ⎫ 1.165μ |
| | | X=0.4 | | 80Å ⎭ |
| 801 & 802 | 250 PERIODS | X=0 | p=10¹⁸ | 21Å ⎫ 1.15μ |
| | | X=0.4 | p=10¹⁸ | 25Å ⎭ |
| 803 | | X=0.4 | | 1.29μ |
| 804 | | X=0.4 | n=10¹⁸ | 1.92μ |
| 805 | | X=0 | n=10¹⁸ | 1728Å |
| 806 | | Si DOPED GaAs | | |

FIG. 9

SYMMETRIC OPTICAL DEVICE WITH QUANTUM WELL ABSORPTION

CROSS-REFERENCE TO RELATED APPLICATION

This application is related to the application Ser. No. 042,202 of H. S. Hinton, A. L. Lentine, and D. A. B. Miller, entitled "Optical Device", filed Apr. 24, 1987.

TECHNICAL FIELD

This invention relates to nonlinear optical devices and particularly to those devices employing high gain or feedback resulting in multistable optical states or other nonlinear optical responses.

BACKGROUND OF THE INVENTION

A nonlinear or bistable optical device having a very low switching energy is described in U.S. Pat. No. 4,546,244, issued to David A. B. Miller on Oct. 8, 1985. This device has a semiconductor quantum well region which is electrically controlled to change its optical absorption and, in turn, the optical state of the device. The device is operated with one or more input light beams. However, a problem of this device is that it has only one output light beam. As a consequence, the device has limited system applications where complementary output light beams are required.

In one configuration where the device is operated with two input light beams, the power of one of the input light beams is maintained at a constant level, and the power of the other light beam is varied to change the optical absorption and the state of the device. A problem with this configuration of the device is that removal of either input beam before the other causes the device to lose its present state.

Another problem with this configuration of the bistable optical device is that once the power level of the constant power level light beam is established, the power range of the variable light beam applied to the device for causing the device to change from one state to another is fixed.

SUMMARY OF THE INVENTION

The foregoing problems and disadvantages are solved and a technical advance is achieved in an illustrative optical device having first and second quantum well regions with complementary high and low absorption levels for emitting first and second output light beams having respective complementary and symmetric low and high power levels in response to two input light beams having equivalent power levels. Advantageously, the corresponding complementary high and low absorption levels of the two quantum wells are substantially equal. Accordingly, the output levels are symmetric and useful in driving "dual-rail" optical logic systems.

The optical device comprises first and second photodetectors each having a quantum well region. The photodetectors are responsive to respective first and second light beams for electrically controlling the optical absorption of each of the quantum well regions. A departure in the art is that the photodetectors increase the optical absorption of one of the quantum well regions and concomitantly decrease the optical absorption of the other quantum well region when the power level of one of the first and second light beams increases relative to the other. In particular, the optical absorption of the two quantum well regions concomitantly assume complementary and symmetric high and low optical absorption levels when a ratio of the power of one to the other of the two input light beams is greater than a predetermined threshold value. Similarly, when this power ratio is less than a second threshold value, the two quantum well regions assume the opposite complementary absorption level. When the power ratio is between the two threshold levels, the device is in a bistable operating region where the quantum well regions maintain their absorption level prior to the device entering the bistable operating region.

This optical device is operable as an optical latch or memory for emitting two light beams having complementary and symmetric high and low power levels representative of, for example, zero and one logic levels. The transmission level of any light beam passing through a quantum well region is reduced in proportion to the optical absorption level of that region. The state of the device is determined by the transmission level of a light beam emitted from a designated one of the quantum well regions. The transmission level of another light beam emitted from the other quantum well region is at a power level complementary to that of the first beam.

Advantageously, the device further comprises an optical attenuator for concomitantly varying the power of the two light beams to the quantum well regions for maintaining the optical absorption level and the state of the device over a wide range of optical input power levels. When the two input light beams have been concomitantly attenuated to a low power level, a much smaller difference in power between the two beams is required for one of the two thresholds to be reached and cause the device to switch states. Thus, for example, the device is responsive to either a small increase in one of the two input beams or an additional control light beam having a low power level to change the state of the device. If the two attenuated light beams are increased, each of the quantum well regions will emit an output light beam having a much higher power level. The device, in effect, exhibits gain between a low power level control light beam and a much higher power level output light beam.

Another advantage of this two quantum well bistable device with the optical attenuator is that when the input light beams are concomitantly removed, the device retains its state for a predetermined period of time. As long as the input beams are concomitantly reapplied to the device within this time period, the device continues to retain the state that it had prior to removal of the beams. Furthermore, periodically refreshing the device with concomitantly applied input light beams maintains the state of the device while substantially reducing optical input power requirements.

Changing the input light beams proportionately together maintains the optical absorption of the two quantum well regions and the present state of the device and permits the device to be operated with input light beams having a wide range of power. This advantage is particularly useful for operating the device as an optical latch or memory.

The optical device further comprises two optical combiners each for combining a bias input light beam and a control input light beam for application to one of the photodetectors. In configuration of the device, the control beams function as set and reset signals for an optical S-R latch.

The attenuator also illustratively comprises a beam splitter for dividing a single light beam into the two bias beams for the two photodetectors.

BRIEF DESCRIPTION OF THE DRAWING

FIG. 9 is a layer diagram of the integrated structure of FIG. 8.

DETAILED DESCRIPTION

Figure 1:
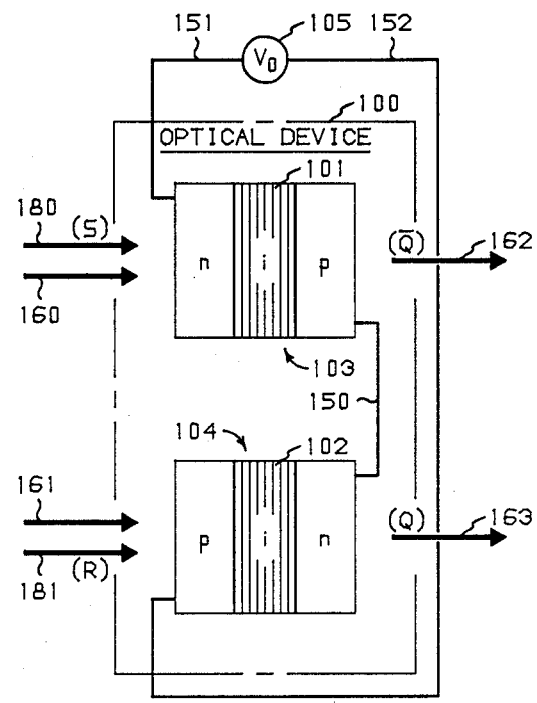
FIG. 1 depicts an illustrative bistable optical device 100 having first and second quantum well regions with complementary high and low optical absorption levels.

Depicted in FIG. 1 is an illustrative bistable optical device 100 having semiconductor multiple quantum well regions 101 and 102 for concomitantly maintaining two complementary and symmetric high and low absorption levels. The two complementary absorption levels of the device represent, for example, the two different logic levels of binary information. When operated as an optical latch or memory for storing information, the information is obtained from or read out of the device by passing bias input light beams 160 and 161 through quantum well regions 101 and 102, respectively. The optical absorption of each quantum well region is at one of two different levels, for example, complementary high and low optical absorption levels. When the optical absorption of one of the two regions is at a high level, the optical absorption of the other region is at a low level. The transmission level of a light beam emitted from a quantum well region is reduced in proportion to the absorption level of the region. Accordingly, when the optical absorption of quantum well region 101 is at a high level, output light beam 162 emitted from the region is at a low transmission level. Since the optical absorption of quantum well region 102 is at a complementary low level, output light beam 163 emitted from the region is at a high transmission level. The state of the device is represented by the transmission level of one of the two output beams such as output light beam 163, whereas the complementary state of the device is represented by the transmission level of output light beam 162. Significantly, complementary and symmetric output light beams 162 and 163 may be utilized to drive other complementary input optical devices used, for example, in a "dual-rail" optical logic system.

The state of the device, as well as the complementary optical absorption levels of the quantum well regions, changes when the difference in optical power applied to the two quantum well regions reaches a level depending on the optical power applied to the two regions. In particular, when a ratio established by the power of light incident on quantum well region 101 relative to the power of the light incident on quantum well region 102 is greater than a first threshold value, the complementary optical absorption levels of the two regions switch, and the state of the device changes. Similarly, when the optical power ratio is less than a second threshold value, the optical absorption of the two regions switch back to its original complementary level.

Optical device 100 comprises photodetectors 103 and 104 electrically interconnected via conductor 150. Each of photodetectors 103 and 104 is a well-known photodiode having n doped, intrinsic, and p doped layers, the n doped layer of photodiode 104 being electrically interconnected to the p doped layer of photodiode 103 via conductor 150. The intrinsic layer of photodiode 103 includes semiconductor multiple quantum well region 101. Similarly, the intrinsic layer of photodiode 104 includes semiconductor multiple quantum well region 102. Photodiodes 103 and 104 are electrically connected in series with electric potential source 105 via conductors 151 and 152 to form an electrical circuit for electrically controlling the optical absorption of the quantum well regions. Source 105 is normally connected so as to reverse bias photodiodes 103 and 104. This requires that a positive voltage appear on the left of source 105 for the circuit as shown in FIG. 1. It is also possible to obtain useful characteristics from the device even though source 105 is omitted and replaced by a short circuit. Advantageously, input light beams 160 and 180 need not be incident on the same area on photodiodes 103, and input light beams 161 and 181 need not be incident on the same area on photodiode 104.

Figure 8:
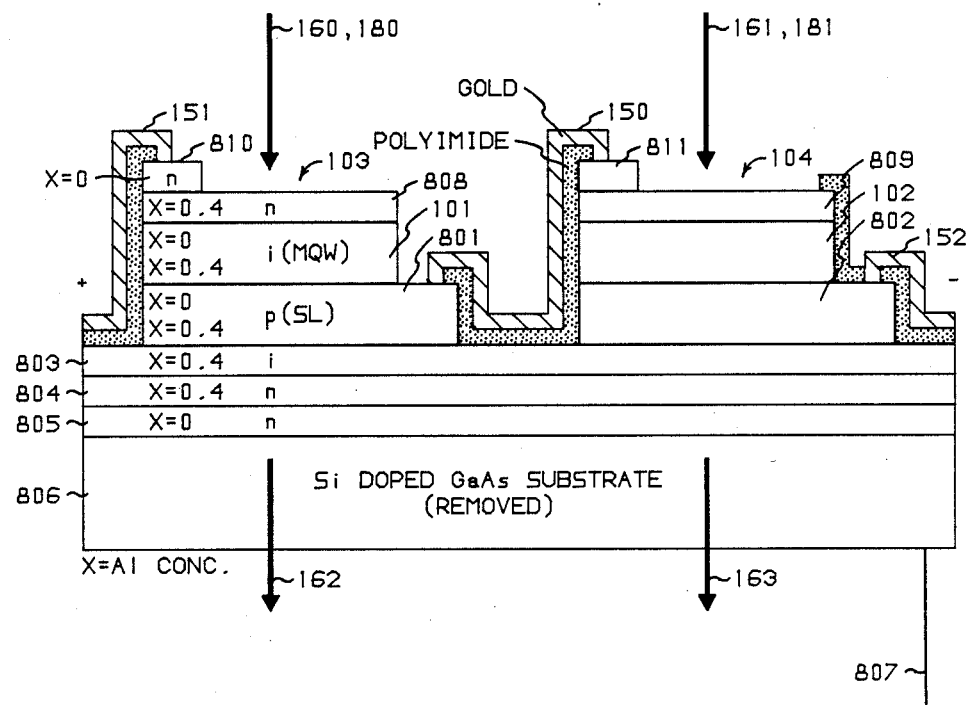
FIG. 8 is a cross section view of the device in an integrated structure.

Optical device 100 is similar to a self-electro-optic effect device; however, the self-electro-optic effect device does not have two semiconductor quantum well regions having complementary high and low optical absorption levels for emitting two complementary low and high transmission level output beams. The self-electro-optic effect device is described in an article by D. A. B. Miller et al., entitled "The Quantum Well Self Electro-Optic Effect Device; Optical Electronic Bistability and Oscillation, and Self-Linearized Modulation", *IEEE Journal of Quantum Electronics*, Vol. QE-21, September, 1985, pages 1462–1476 and further described in an article by D. A. B. Miller et al., entitled "Integrated Quantum Well Self-Electro-Optic Effect Device; Array of Optically Bistable Switches", *Applied Physics Letters*, Vol. 49, September, 1986, pages 821–823. U.S. Pat. No. 4,546,244, describes how to make a self-electro-optic effect device that will have two stable states. The article by J. S. Werner et al., entitled "Low-Voltage Modulator and Self-Biased Self-Electro-Optic Effect Device", *Electronics Letters*, Vol. 23, Jan. 16, 1987, pages 75–77 describes how to make a SEED without any external source of electrical potential. These references may be used by one ordinarily skilled in the art to make optical device 100 having two semiconductor multiple quantum well regions. Shown in FIG. 8 is a cross-sectional view of device 100 in an integrated structure. This symmetric device includes p-i-n photodiodes 103 and 104 with respective quantum well regions 101 and 102 in the intrinsic layer. The material of the integrated structure was grown by molecular beam epitaxy on a Si doped n substrate. The multiple quantum well p-i-n diodes are made by etching separate mesas ($\sim 200 \times 200 \mu m$ in this case) and electrically connecting two such mesas in series. Simultaneously fabricating the two diodes close to each other ensures nearly identical characteristics. The resultant device showed bistability for voltages as low as 6 volts. We observed bistable switching down to a 300 ns switching time with 2 mW of optical input power (the maximum power available) on these relatively large devices. Preliminary tests indicate the same reciprocal power/speed trade-off as in previous SEEDs with energy densities also comparably low. Each of quantum well regions 101 and 102 consists of 63 periods of GaAs and AlGaAs 105 Angstroms and 80 Angstroms thick, respectively.

The device structure as shown in FIG. 8 is designed with an additional diode structure formed from p regions 801 and 802, intrinsic region 803 and n regions 804, 805, and substrate 806. The substrate 806 and layer 805 are removed by chemical etching in the regions where beams 162 and 163 emerge so that beams 162 and 163 are not absorbed by the substrate or layer 805. The substrate is retained in at least one other portion of the device so that an electrical connection 807 may be made to the substrate. In one exemplary mode of operation of the structure as shown FIG. 8, the electrical connection 807 is connected to the same positive potential as connection 151. The additional layers 803 and 804 are designed to be substantially transparent to beams 162 and 163. The junction of layers 803 and 804 is to provide electrical isolation between regions 801 and 802 while still allowing them to be grown on the same substrate 806. The isolation is enhanced by the connection of connection 807 to a positive potential as reverse biased diodes result. Other methods of isolation will be obvious to those skilled in the art, such as proton bombardment. A detailed layer structure from which the structure in FIG. 8 may be fabricated by well known etching, photolithographic, deposition and contacting techniques is shown in FIG. 9. Such a layer structure may be grown by molecular beam epitaxy. $N=10^8$ means that a doping density of approximately $10^{18}$ silicon atoms per cubic centimeter was introduced during growth. Similarly, $P=10^{18}$ means that a doping density of approximately $10^{18}$ beryllium atoms was introduced during growth. The value x refers to the mole fraction of aluminum in the compound $AL_x Ga_{1-x} As$. $X=0$ implies that the layer is GaAs. The regions 101 and 102 in this embodiment (the MQW region) consists of 63 pairs of $x=0$ and $x=0.4$ layers as shown in FIG. 9. The superlattice (SL) region 801 and 802 in this embodiment consists of 250 pairs of alternating $x=0$ and $x=0.4$ layers as shown in FIG. 9. The substrate 806 was doped with silicon during growth.

A device constructed as in FIG. 8 and FIG. 9 showed bistable behavior for an input light wavelength of 855.8 nm. Fabrication of the two diodes 103 and 104 from the same material and adjacent to one another ensures nearly identical characteristics for these two diodes, which is advantageous in obtaining symmetrical operation.

Photodiodes 103 and 104 are responsive to light beams 160 and 161, respectively, for generating a photocurrent in the electrical circuit formed by the two photodiodes and electric potential source 105. In response to the photocurrent, the two photodiodes electrically control the optical absorption of quantum well regions 101 and 102 by controlling the voltage across the two quantum well regions. The optical absorption of the quantum well regions varies as a function of the voltage across the region.

Bistable optical device 100 changes from one state to the other by increasing the power of the light incident on one of photodiode 103 and 104 relative to the power incident on the other photodiode. More particularly, when the ratio of the power of the light incident on one of the two photodiodes relative to the power of the light on the other photodiode is greater than a first predetermined threshold value, the optical absorption of the two quantum well regions changes to its complementary level. For example, when the ratio of the power of light beam 160 to light beam 161 is greater than the first predetermined threshold value, the optical absorption of quantum well region 102 changes from a high to a low level, and the optical absorption of quantum well region 101 concomitantly changes from a low to a high level. Similarly, the optical absorption of the two quantum well regions will switch back to their initial complementary levels when the ratio of the power of light beam 162 relative to the power of light beam 161 is less than a second predetermined threshold value. When the power ratio of light beam 160 to light beam 161 is between the two threshold values, the device is in a bistable operating region where it maintains its state prior to entering the bistable region.

Another manner of changing the state of optical device 100 is to maintain light beams 160 and 161 at equivalent power levels and to apply one of either control light beams 180 and 181 to respective photodiodes 103 and 104. However, the power ratio of the light incident on the two photodiodes must be greater than the first threshold value or less than the second threshold value to cause the optical device to switch states. Accordingly, the combined power of light beam 160 and control beam 180 relative to the power of light beam 161 must exceed the first threshold to cause the optical device to switch states.

The optical absorption of quantum well region 102 is determined by tne attenuation of a light beam passing through the region. In one state of the device, the optical absorption of quantum well region 102 is at a low level, thereby attenuating light beam 161 passing through the region and emitted as output light beam 163 a small amount such as 3 db. As a result, the transmission level as well as the state of the device, of output light beam 163 is at a high transmission level. Concomitantly, the optical absorption of quantum well region 101 is at a high level, and the transmission level of output light beam 162, as well as the complementary state of the device, is at a low transmission level. When the optical absorption of a quantum well region is at a high level, a light beam passing through the region is attenuated a greater amount such as 6 db.

Similarly, the optical absorption of the two quantum well regions will switch to their complementary absorption levels when the ratio of power incidented on the two photodiodes is less than the second predetermined threshold value. For example, when the power of light beam 160 to the combined power of light beam 161 and control light beam 181 is less than the second predetermined threshold value the transmission level of light beam 163, as well as the state of the device, will change from a high to a low. Concomitantly, the transmission level of output light beam 162, as well as the complementary state of the device, will change from a low to a high.

Figure 4:
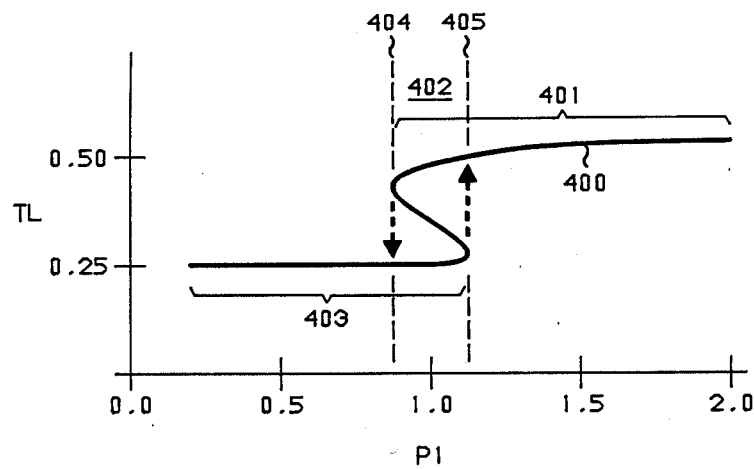
FIG. 4 depicts an illustrative transmission level curve of optical device 100 of FIG. 1.

Depicted in FIG. 4 is an illustrative curve 400 of the transmission level of quantum well region 102 as a function of the ratio P1 of the combined power of input light beams 160 and 180 relative to the combined power of input light beams 161 and 181. The power of output light beam 163 relative to the combined power of input light beams 161 and 181 characterizes the transmission level TL of quantum well region 102. As previously described, the transmission level of the quantum well region, as well as that of the beam emitted therefrom, decreases in proportion to the optical absorption level of the region. As used herein, a light beam represents the combined optical power incident on a particular photodiode. Accordingly, a light beam may be the combination of one or more light beams. Transmission level curve has a high transmission level portion 401 and a low transmission level portion 403 that overlap in bistable operating region 402 of the graph between input power ratio P1 straight lines 404 and 405. In the bistable region of the device, a light beam emitted from the device in response to an input beam having a given power level is at one of two possible stable power levels. The operating history of the devices determines which one of the two levels the optical absorption or output light beam will assume. Assuming the transmission level of quantum well region is initially at a low transmission level 403, the transmission level of the quantum well region, as well as the state of the device, will change to a high level when the power ratio P1 of input light beams 160 and 180 relative to input light beams 161 and 181 exceeds a first threshold value indicated by line 405 somewhere between 1.0 and 1.5 of power ratio P1. It is assumed that the responsivity of photodetectors 103 and 104 are equivalent. It has also been assumed for simplicity that the bistable region includes the ratio P1 equals 1.0. This ratio depends on the design of photodiodes 103 and 104, and when photodiodes 103 and 104 are not substantially identical, it may be necessary to use another ratio value as the operating point.

Having assumed the high transmission level, quantum well region 102 maintains its high transmission level until the power ratio is less than a second threshold level indicated by straight line 404 somewhere between 0.5 and 1.0. This occurs when a ratio of power incident on the two photodiodes is less than a second threshold level which causes the quantum well to change from a high to a low transmission level. In low transmission level portion 403 of the curve, the optical absorption of quantum well region 102 is at a high level.

In bistable region 402 of the curve, the quantum well region 102 remains at its transmission level prior to entering the bistable region. For example, when the quantum well region 102 is at a high transmission level, it will remain in the high transmission level while in the bistable region. As the combined power of light beams 160 and 180 is decreased or the combined power of light beams 161 and 181 is increased, the power ratio will decrease until it reaches the second threshold level indicated by line 404. Below the second threshold value, the quantum well region 102 switches from a high to a low transmission level. Similarly, when the transmission level of the quantum level is low, it will remain in the low transmission level until the power ratio is greater than the first threshold value indicated by line 405. The transmission level curve of quantum well region 101 is the opposite of transmission level curve 400 of quantum well region 102. In particular, quantum well region 101 has a high transmission level portion over the same region as low transmission 403 of quantum well 102. Quantum well region 101 has a low transmission level portion over the same range of high transmission level portion 401 of region 102.

Figure 6:
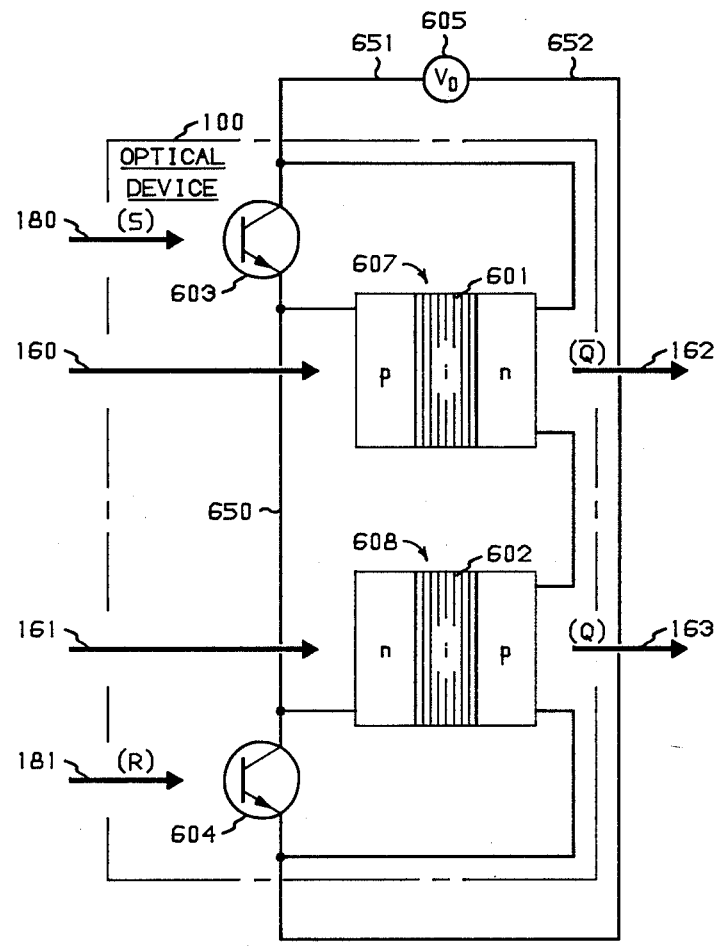
FIG. 6 is another configuration of the optical device of FIG. 1.

Depicted in FIG. 6 is another configuration of optical device 100. In this configuration, semiconductor multiple quantum well regions 601 and 602 are included in the intrinsic layer of respective structures 607 and 608 which are well-known photodiodes. Photodetectors 603 and 604 are electrically interconnected via conductor 650 and further connected in series with source of electric potential 605 via conductors 651 and 652. Photodetectors 603 and 604 are well-known phototransistors. Photodiodes 607 and 608 are electrically connected in parallel across respective phototransistors 603 and 604 as shown. Light beams 160 and 161 pass through respective quantum well regions 601 and 602 and are emitted as output light beams 162 and 163. Phototransistors 603 and 604 are responsive to respective control light beams 180 and 181 for electrically controlling the optical absorption of quantum well region 601 and 602. The operation of optical device 100 in this particular configuration is similar to that of the configuration of optical device 100 as shown in FIG. 1. The quantum well regions 601 and 602 are included in respective structures 607 and 608 separate and apart from photodetectors 603 and 604. However, the entire device could be easily integrated into a single structure.

Figure 7:
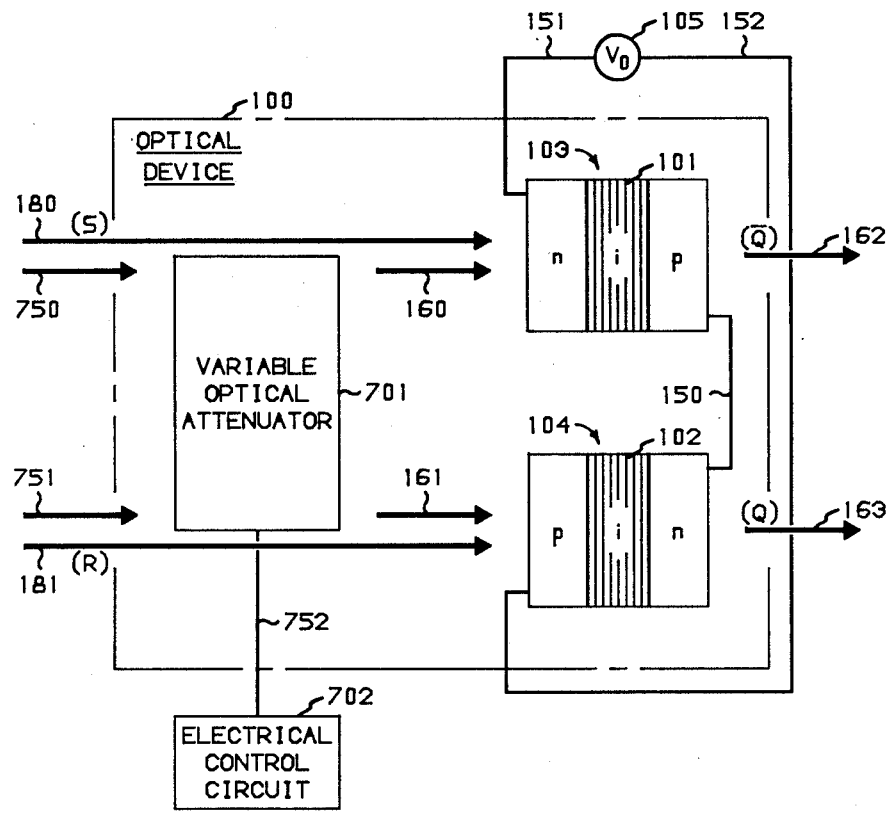
FIG. 7 depicts the optical device of FIG. 1 further including a variable optical attenuator for maintaining the state of the device over a wide range of optical input power levels.

Depicted in FIG. 7 is still another configuration of optical device 100 further including variable optical attenuator 701 concomitantly varying optical input beams 160 and 161 without changing the state of the device. As used herein, concomitantly means substantially simultaneously. Variable optical attenuator 701 is a well-known and commercially available unit such as an acousto-optic modulator which is controllable by a suitable electrical control signal applied thereto on conductor 752 from a well-known electrical control circuit 702. Light beams 750 and 751 having equivalent power levels are applied to variable optical attenuator 701 and emitted as respective light beams 160 and 161. When the power level of light beams 160 and 161 have been attenuated to a low level relative to respective light beams 750 and 751, only a small power increase in one of attenuated light beams 160 and 161 or the application of either low power level control light beams 180 or 181 switches the optical absorption of quantum well region 102 from one level to another and correspondingly changes the state of the device. Attenuator 701 concomitantly increases the power level of input light beams 160 and 161 relative to that of 750 and 751 to read out the stored information at a high power level, thereby providing, in effect, optical power gain relative to either control light beams 180 and 181 which is useful in driving other optical devices. Device 100 will also retain its state when light beams 160 and 161 have been completely removed for a limited period of time such as at least ten seconds if the attenuator is operated as a shutter. Opening the shutter, device 100 would return to its state prior to the closing of the shutter.

When operating optical device 100 as an optical latch or memory, it is desirable to operate the device in the bistable operating region of its transmission level curve. In this exemplary mode of operation, the power level of light beams 750 and 751 are equivalent so that the device remains in its bistable operating region. In response to control circuit 702, optical attenuator 701 concomitantly varies the power of light beams 750 and 751 so that emitted light beams 160 and 161 are attenuated by substantially equal fractions. Accordingly, the device remains in the same state over a substantial range of concomitantly varied power levels of light beams 160 and 161. As long as the power ratio of the two light beams remains between the first and second threshold values, device 100 will remain in its present state. Control beams 180 and 181 are treated as set (S) and reset (R) input signals to a S-R optical latch.

Figure 2:
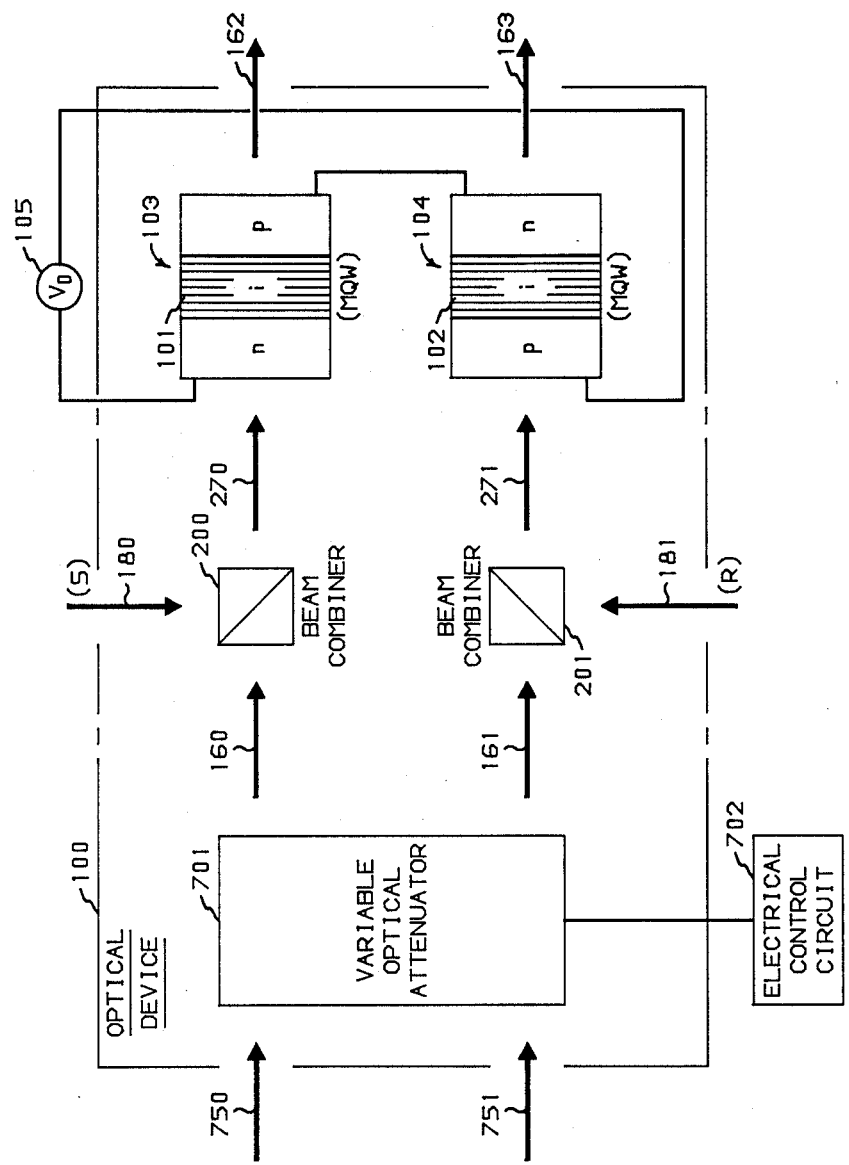
FIG. 2 depicts a modified version of optical device 100 as shown in FIG. 7.

A modification version of the configuration of optical device 100 of FIG. 7 is shown in FIG. 2. In this modified configuration, light beams 160 and 161 from optical attenuator 701 are directed to optical combiners 200 and 201, respectively. These optical combiners are well-known and commercially available units. Control beams 180 and 181 are also applied to combiners 200 and 201, respectively. Optical combiner unit 200 combines bias light beams 160 and control beam 180 to form light beam 270 which has a power level equivalent of the sum of the power levels of the two light beams. Similarly, optical combiner unit 201 combines bias light beam 161 and control light beam 181 to form light beam 271 having a power level equivalent to the sum of the power levels of the two beams. Light beams 270 and 271 are then applied to respective photodiodes 103 and 104 of the device as previously described.

Figure 3:
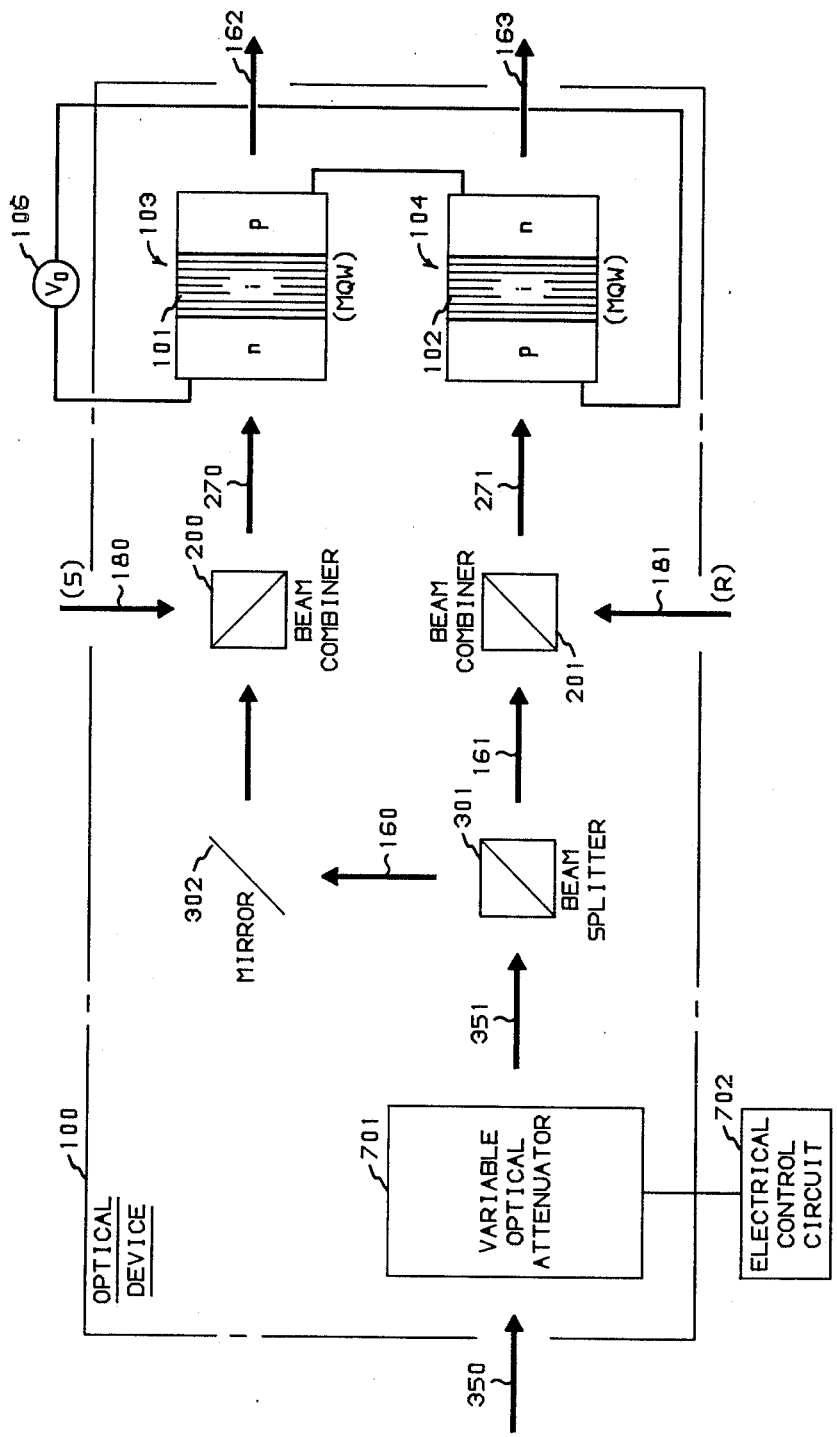
FIG. 3 depicts a further modified version of the optical device of FIG. 2.

The modified configuration of optical device 100 as shown in FIG. 2 may be further modified as shown in the illustrative embodiment of the invention in FIG. 3. In this further modified configuration, well-known beam splitter 301 and an optical mirror 302 eliminate the need for two bias light beams being applied to optical attenuator 701. Here optical attenuator 703 variably attenuates a single input light beam 350 and directs the emitted light beam 351 to beam splitter 301. The beam splitter divides light beam 351 into light beams 160 and 161 in a ratio appropriate to bias the device in the bistable region. Beam splitter 301 directly transmits light beam 161 to optical combiner 201 which combines the beam with control light beam 181 to form light beam 271. Beam splitter 301 directs light beam 160 to optical combiner via mirror 302 as shown. Optical combiner 200 combines light beams 160 and 180 to form light beam 270.

Figure 5:
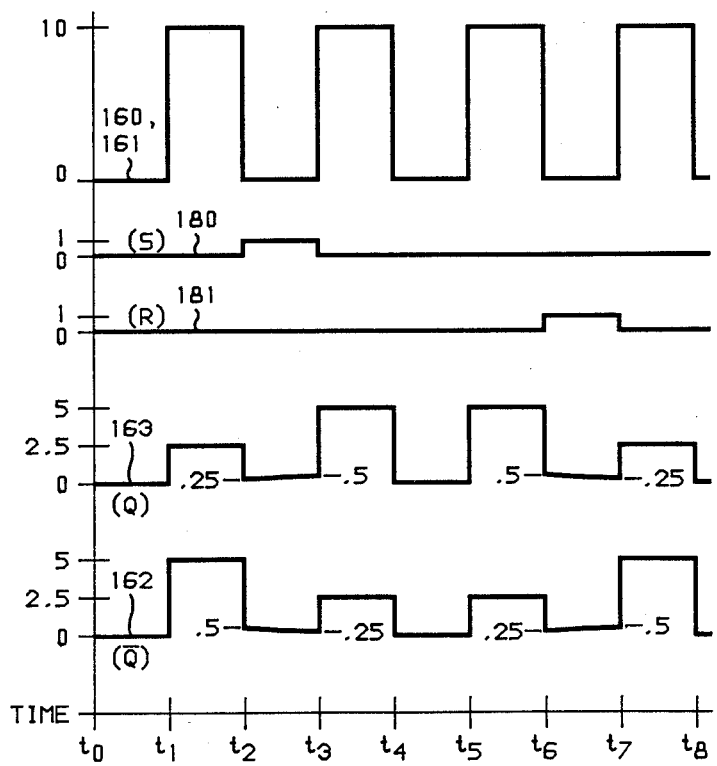
FIG. 5 is a timing diagram of optical device 100 of FIG. 7, operated as a clocked optical S-R latch.

Depicted in the timing diagram of FIG. 5 is a graphical representation of idealized bias light beams 160 and 161, set (S) control beam 180, reset (R) control beam 181, output (Q) light beam 163, and complementary ($\overline{Q}$) output light beam 162 of optical device 100 operated as a clocked optical S-R latch, all plotted with respect to time. Optical device 100 includes the variable optical attenuator 701 as shown in the configuration in FIG. 7. As shown in FIG. 5, each of bias light beams 160 and 161 has two optical power levels consisting of zero and ten units. Variable optical attenuator 701 emits these signals in response to electrical control circuit 702. As shown, the two power levels of light beams 160 and 161 alternate between 0 and 10 units during alternate time periods. It is assumed for simplicity the ratio P1 equals 1.0 and fall within the bistable operating region of the device. Each of set and reset control signals has two power levels consisting of 0 and 1 units. Output (Q) light beam 163 emitted from photodiode 104 and complementary output ($\overline{Q}$) light beam 162 emitted from photodiode 103 have power levels consisting of 0, 0.25, 0.5, 2.5, and 5.0 as shown.

During the period between times $t_0$ and $t_1$, the power level of light beams 160–163, 180 and 181 are all at 0. It will be assumed that the initial state of the device is at a low transmission with a complementary high transmission level state. During the period between times $t_1$ and $t_2$, bias light beams 160 and 161 assume and maintain a power level of ten units, and output (Q) light beam 163 assumes and maintains a power level of 2.5 units representative of a low transmission level. Complementary output ($\overline{Q}$) light beam 162 assumes and maintains a power level of 5.0 units indicative of a high transmission level. These two output signals may be used to represent the level of information and its complement stored within the device.

During the period between times $t_2$ and $t_3$, optical bias beams 160 and 161 maintain to a 0 power level, and the power level of set (S) control light beam 180 changes to 1.0 units. The state of the device changes to its complementary level, indicated by output (Q) light beam 163 exponentially changing from a level of 0.25 to 0.50 power units. Similarly, the power level of complementary output ($\overline{Q}$) light beam 162 changes from 0.5 to 0.25 units.

During the period between times $t_3$ and $t_4$, the state of the device and the stored information is obtained or read out of the device. The power level of bias light beams 160 and 161 concomitantly change to 10 units. As anticipated, the power level of output light beams 162 and 163 changes to 2.5 and 5.0 units, respectively. The transmission level of the output beams 162 and 163 indicate that the complementary states of the device have changed.

During the period between times $t_4$ and $t_5$, all of the light beams assume a 0 power unit level.

During the next period between times $t_5$ and $t_6$, the state of the device and stored information is once again obtained as previously described between times $t_3$ and $t_4$.

During the period between times $t_5$ and $t_6$, reset (R) control light beam 181 changes to 1.0 power units for resetting the state of the device back to its initially assumed state. As shown, output (Q) light beam 163 exponentially changes from 0.50 to 0.25 power units, and complementary output ($\overline{Q}$) light beam 162 changes from 0.25 to 0.5 power units.

During the period between times $t_7$ and $t_8$, bias light beams 160 and 161 once again assume a high power level to obtain the state of the device. Output (Q) light beam 163 assumes a low transmission power level at 2.5 units, whereas complementary output (Q) light beam 162 assumes a high transmission power level at 5.0 units.

After time $t_8$, all the optical light signals assume a 0 power unit level. When the light beams 160 and 161 are completely attenuated to zero, the device will retain its state for a finite time that is determined by leakage currents in the device or other causes. However, this time period may be usefully long such as at least 10 seconds when operating the device as an optical memory.

It is to be understood that the above-described optical device is merely an illustrative embodiment of the principles of this invention and that numerous other optical devices may be devised by those skilled in the art without departing from the scope of the invention. In particular, one skilled in the art may develop a number of other optical memory devices using several multiple quantum well regions for producing complementary output high and low level output light beams.

What is claimed is:

1. An optical device comprising:
   first and second means including respective first and second quantum well regions and responsive to first and second light beams, respectively, for electrically controlling an optical absorption of each of said first and second quantum well regions, the optical absorption of said first quantum well region assuming a first predetermined level and the optical absorption of said second quantum well region concomitantly assuming a second predetermined level when a ratio of power of said first to said second light beam is greater than a first predetermined value.

2. The optical device of claim 1 wherein said first quantum well region is responsive to a third light beam having power for attenuating the power of said third light beam a first predetermined amount and said second quantum well region is responsive to a fourth light beam having power equivalent to the power of said third light beam for attenuating the power of said fourth light beam a second predetermined amount when the optical absorption of said first and second quantum well regions is at said first and second predetermined levels, respectively.

3. The optical device of claim 2 wherein the optical absorption of said first quantum well region is for assuming said second predetermined level and the optical absorption of said second quantum well region is for concomitantly assuming said first predetermined level when said ratio of power of said first to said second light beam is less than a second predetermined value.

4. The optical device of claim 3 wherein said first quantum well region is responsive to said third light beam for attenuating the power of said third light beam said second predetermined amount and said second quantum well region is responsive to said fourth light beam for attenuating said fourth light beam said first predetermined amount.

5. The device of claim 2 further comprising
means for concomitantly varying said third and fourth light beams for maintaining the optical absorption of said first and second quantum well regions at said first and second predetermined levels, respectively.

6. The device of claim 5 wherein said means for concomitantly varying said third and fourth light beams includes beam splitter means for splitting a fifth light beam into said third and fourth light beams.

7. The device of claim 6 wherein said means for concomitantly varying said third and fourth light beams further includes director means for directing said third light beams from said beam splitter means to said first means.

8. The device of claim 2 wherein said first means is responsive to an increase in optical power of said first light beam for controlling the optical absorption of said first quantum well region to assume one of said first and second predetermined levels and wherein said device further comprises means for increasing the optical power of said first light beam to said first means.

9. The device of claim 8 wherein said second means is responsive to an increase in optical power of said second light beam for controlling the optical absorption of said second quantum well region to assume the other of said first and second predetermined levels and wherein said device further comprises means for increasing the optical power of said second light beam to said second means.

10. An optical device comprising:
first and second structures having respective first and second semiconductor quantum well regions; and
first and second photodetector means responsive to light for generating a photocurrent, said first and second photodetector means being responsive to said photocurrent for electrically controlling an optical absorption of each of said first and second semiconductor quantum well regions, said first and second photodetector means increasing the optical absorption of one of said first and second semiconductor quantum well regions and decreasing the optical absorption of another one of said first and second semiconductor quantum well regions when power of the light incident on said one of said first and second photodetector means increases relative to power of the light incident on said other of said first and second photodetector means.

11. The optical device of claim 10 wherein said first photodetector means comprises said first structure.

12. The optical device of claim 11 wherein said second photodetector means comprises said second structure.

13. The device of claim 12 further comprising means for concomitantly varying the power of the light to said first and second photodetector means.

14. The device of claim 13 further comprising beam splitter means for splitting the light into first and second light beams for said first and second photodetector means, respectively.

15. The device of claim 14 further comprising director means for directing said first light beam to said first photodetector means.

16. The device of claim 14 wherein said means for concomitantly varying said light comprises an electro-optic modulator.

17. The device of claim 12 further comprising means for electrically connecting said first and second photodetector means in series to a source of electrical potential to form an electrical circuit.

18. An optical device comprising:
first and second photodetector means responsive to first and second light beams, respectively, for generating a photocurrent, said first and second photodetector means having respective first and second semiconductor quantum well regions, said first and second photodetector means being responsive to said photocurrent for electrically controlling an optical absorption of each of said first and second quantum well regions, said first and second photodetector means increasing the optical absorption of one said first and second quantum well regions and decreasing the optical absorption of another one of said first and second quantum well regions when the power of one of said first and second light beams increases relative to the power of the other of said first and second light beams.

19. The device of claim 18 wherein the optical absorption of one of said first and second quantum well regions assumes a first predetermined level and the optical absorption of said other quantum well region concomitantly assumes a second predetermined level when a first ratio of the power of one to the other of said first and second light beams exceeds a first predetermined value.

20. The device of claim 19 wherein the optical absorption of said one quantum well region assumes a third predetermined level and the optical absorption of said other quantum well region concomitantly assumes a fourth predetermined level when a second ratio of the power of said other to said one of said first and second light beams exceeds a second predetermined value.

21. The device of claim 20 wherein said first quantum well region at said first optical absorption level is responsive to a third light beam for attenuating said third light beam a first predetermined amount and said second quantum well region at said second optical absorption level is responsive to a fourth light beam for attenuating said fourth light beam a second predetermined amount.

22. The device of claim 21 wherein said first quantum well at said third optical absorption level is responsive to said third light beam for attenuating said third light beam a third predetermined amount and said second quantum well region at said fourth optical absorption level is responsive to said fourth light beam for attenuating said fourth light beam a fourth predetermined amount.

* * * * *